Nov. 22, 1955 N. PRITIKIN 2,724,674
PRINTED CIRCUIT AND METHOD FOR PRODUCING THE SAME
Filed Nov. 26, 1952
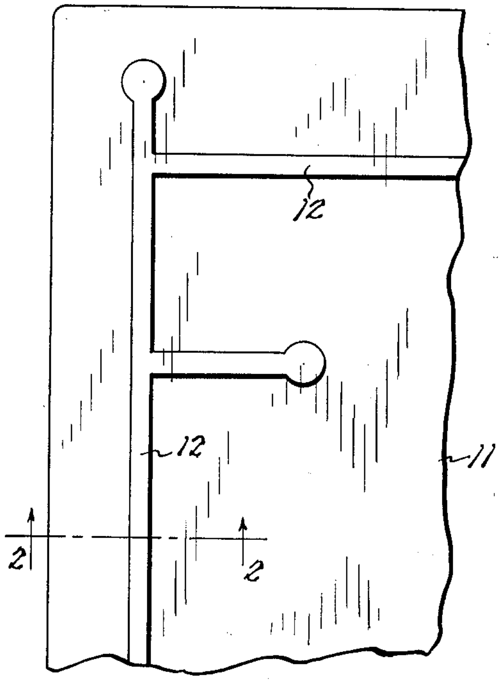
Fig. 1.
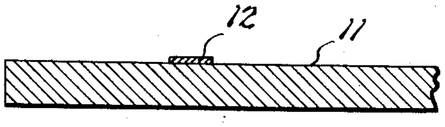
Fig. 2.
Fig. 3.
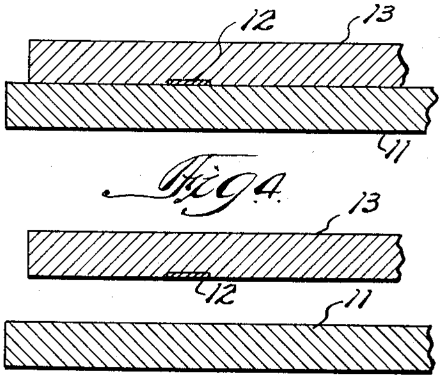
Fig. 3. Fig. 4.
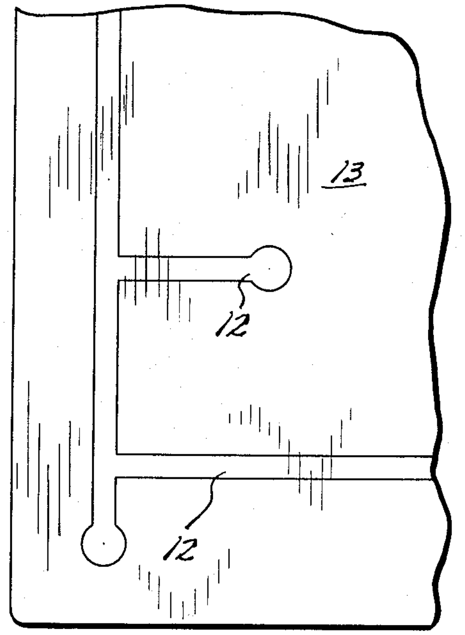
Fig. 5.
INVENTOR.
Nathan Pritikin.
BY.
Thiess, Olson, Mecklenburger, von Holst & Coltman.
Attys.

United States Patent Office 2,724,674

Patented Nov. 22, 1955

2,724,674

PRINTED CIRCUIT AND METHOD FOR PRODUCING THE SAME

Nathan Pritikin, Chicago, Ill.

Application November 26, 1952, Serial No. 322,742

10 Claims. (Cl. 154—95)

This invention relates to an embedded printed circuit and a method of producing printed circuits, and it is an object of the invention to provide an improved product and method of that character.

According to present practice, printed circuits employing plastic conducting material are produced by painting, screening, printing, rolling or otherwise applying the plastic conducting material to an insulating sheet in the desired configuration. The plastic conducting material is then permitted to dry or set, or is subjected to temperatures which cause thermal setting thereof, depending upon the type of plastic conducting material employed. This results in a printed circuit in which the conducting material projects above the surface of the insulating sheet to which it is applied. For reasons well recognized in the art, it is preferable that the conducting material be embedded in the insulating sheet such that a flush surface is obtained.

According to one embodiment of the invention, a temporary base is employed upon which plastic conducting material is painted, screened, printed, rolled or otherwise applied. The material which is to form the permanent base of the printed circuit is then applied against the surface of the temporary base and against the surface of the conducting material after the conducting material has had an opportunity to harden or set. The material forming the permanent base is made sufficiently plastic that it may receive the conducting material and bear against the exposed surface of the temporary base.

After the plastic material forming the permanent base has had an opportunity to harden or set, it is removed from the temporary base. The various materials employed are such that the conducting material adheres to the permanent base much more strongly than to the temporary base, whereby it is removed from the temporary base and adheres to the permanent base. By this means a printed circuit is produced having a flush surface, that is, the conducting material is embedded in the insulating base.

By this process a printed circuit may be produced having very stable conducting portions which must be fired, or otherwise fixed, at a temperature which would destroy the insulating or base portions if the latter were subjected to such temperatures.

Accordingly, it is another object of the invention to provide an improved printed circuit in which the conducting elements are embedded in the insulating base to provide a flush surface. It is another object of the invention to provide an improved method for producing such a printed circuit.

It is another object of the invention to provide an improved and very simple and economical method of producing printed circuits in which the conducting material is embedded in the insulating base.

It is another object of the invention to provide a printed circuit in which the conducting portions and the base portion are of such character that the conducting portions are fired or otherwise fixed at a temperature which the base portion cannot withstand without deterioration.

This invention, together with further objects and advantages thereof, will best be understood by reference to the following description taken in connection with the accompanying drawing, and its scope will be pointed out in the appended claims.

In the drawing, in which like parts are designated by like reference numerals,

Figure 1 is a partial plan view of a temporary base with conducting material for a printed circuit applied thereto;

Fig. 2 is a greatly enlarged cross section taken along line 2—2 of Fig. 1;

Fig. 3 is a cross-sectional view similar to Fig. 2, illustrating a later step in the process which constitutes one feature of the present invention;

Fig. 4 is a view similar to Fig. 3, but showing a still later step of the process; and Fig. 5 is a partial plan view of a completed printed circuit.

The present invention contemplates the use of a temporary base 11 on which conducting material 12 is applied in the desired pattern by painting, screening, printing, rolling or by other process. The temporary base 11 may be of any suitable material, and preferably is a polished stainless steel plate.

The conducting material 12 may also be any one of many widely different materials and is preferably plastic to permit its application by one of the common processes referred to above. The term "plastic" as employed in this application is to be construed broadly as meaning any moldable material, including liquids. One recommended material is a thermosetting plastic containing small particles of metallic or other conducting materials. Such thermosetting conducting compounds are very commonly employed in the art and hence need not be specifically described herein.

The conducting material 12 extends, of course, above the surface of the plate 11, as illustrated in Fig. 2. Following application of the conducting material to the temporary base the solvents contained in the thermosetting carrier are permitted to evaporate or are driven off by the application of heat. The thermosetting material of the conducting strips 12 may or may not be cured at this point. Preferably, however, it is left uncured but with the solvents removed.

A permanent base 13 for the printed circuit is then pressed against the upper surface of the plate 11 and of the conducting strips 12, as indicated in Fig. 3. The material of the permanent base 13 may be any one of many different materials as long as it is sufficiently plastic to receive the conducting strips 12 and bear against the face of the temporary base 11. In accordance with one embodiment of the invention, a thermosetting material is employed for this purpose, many of which are well known and commonly used in the art.

It should be further noted that the material forming the permanent base 13 may be applied in sheet form, or may be applied in bulk form and pressed or molded to form a sheet. Furthermore, a relatively thin flexible sheet material may be employed which may or may not be backed by a sheet of relatively rigid material. Since the solvents originally contained in the conducting plastic material 12 have previously been permitted to evaporate or have been driven off, the conducting strips 12 are sufficiently firm that they retain substantially their original shape during the application of the permanent base 13.

The entire assembly of permanent base, conducting strips, and temporary base is now subjected to suitable pressure and temperature to thermally set the plastic materials contained in the conducting strips and in the permanent base.

Following this curing of the plastic materials the completed printed circuit comprising the permanent base 13 and the conducting strips 12 may readily be pulled away from the temporary base 11 or may be removed by mechanical or thermal shock, as suggested in Fig. 4. The printed circuit is then complete, as illustrated in Figs. 4 and 5.

Attention is directed to the fact that the final pattern of the printed circuit, illustrated in Fig. 5, is the reverse or mirror image of the pattern applied to the temporary base 11, illustrated in Fig. 1. This, of course, should be taken into consideration in applying the conducting material 12 to the temporary base 11.

By the simple process described above it is possible to produce an embedded printed circuit with all its obvious attendant advantages. This process requires, basically, no more operations than those required to produce a printed circuit in which the conducting strips extend above the surface of the insulating base.

This process also lends itself readily to the formation of embedded printed circuits incorporating various materials for the conduction portions and for the base portion. The materials of each of these two portions of the printed circuit may be materials which could not be combined by previously known processes. For example, the conducting strips 12 of the printed circuit may be a fired on combination of glass and metal. One recommended composition of this character includes 10% of glass frit and 90% of silver, such as Metal Disintegrating Company No. 750 silver flakes. These solid materials are mixed with a carrier such as one consisting of one-third ethyl cellulose and two-thirds pine oil, the solid materials and the carrier being in a one to one ratio. This mixture can be applied to the temporary base 11 in the desired pattern by any one of several processes, including screening. It can then be fired at a temperature of approximately 1100° F., the recommended temperature depending upon the type of glass frit employed, and being of such value as to cause softening of the glass frit.

After the conducting material has been fired, the material which is to form the permanent base 13 is applied as hereinbefore described, and after being allowed to set, harden, or otherwise become fixed, the permanent base and the conducting material embedded therein are removed from the temporary base.

The permanent base material may, for example, be a thermosetting plastic. This combination of a fired, glass and metal, conducting medium and a thermosetting plastic base is an example of one which cannot be produced by previously known methods, since the conducting material must be fired at a temperature which would destroy or at least greatly deteriorate the thermosetting plastic base.

The permanent base may also be of glass or of ceramic with a glass surface, the conducting medium being embedded in the glass surface. In such case the conducting strips, previously applied to the temporary base, must be capable of retaining their shape and otherwise resisting the high temperature required in molding the permanent base without detrimental effects.

The advantages of a fired conducting medium such as that specified above are well understood in the art and include great resistance to abrasion, and solderability. The advantages of a plastic permanent base are also well known in the art and include, primarily, ease of handling, and economy, in combination with toughness and good insulating properties. This method, then, lends itself to the production of printed circuits having properties and advantages not previously obtainable.

The material forming the stable and abrasion resistant metallic conducting medium does not necessarily include a binder such as glass frit. The metallic conducting material, itself, may be one which has a sufficiently low melting point that it may be fired or fused to itself, without resulting in substantial adherence to the temporary base, at conveniently low temperatures but which remains stable well above normal operating temperatures of the printed circuit. Such metals are, by way of example, aluminum, solders (preferably relatively high temperature solders such as silver solders), and brazing compounds. In such cases, that is, where an all metal conducting medium is to be used, a carrier, such as that suggested above in connection with a glass frit and metal conducting medium, is required for convenient application of the conducting material in a desired pattern. Also, a flux is normally required to assure joining of the metal particles during firing. By way of example, rosin may be incorporated with tin lead solders, and boric acid may be incorporated with various brazing compounds. Required proportions of flux to metal are not critical and are well known in the art.

While particular embodiments of the invention have been shown, it will be understood, of course, that the invention is not limited thereto since many modifications may be made, and it is, therefore, contemplated to cover by the appended claims any such modifications as fall within the true spirit and scope of the invention.

The invention having thus been described, what is claimed and desired to be secured by Letters Patent is:

1. The method of producing an embedded printed circuit which comprises applying to a smooth-surfaced temporary base an electrically conductive mixture of glass and metal particles and a carrier in a pattern corresponding to the pattern of a desired printed circuit, firing said conductive mixture by subjecting said mixture to a temperature sufficient at least to soften the glass particles, applying an organic plastic insulating material against said temporary base and against said conducting mixture, and separating said insulating material and said conducting mixture from said temporary base.

2. The method of producing an embedded printed circuit which comprises applying to a smooth-surfaced temporary base an electrically conductive mixture of glass and metal particles and a carrier in a pattern corresponding to the pattern of a desired printed circuit, firing said conductive mixture by subjecting said mixture to a temperature sufficient at least to soften the glass particles, applying a thermosetting plastic insulating material against said temporary base and against said conducting mixture, subjecting said plastic to heat and pressure to thermally set said plastic material, and separating said insulating material and said conducting mixture from said temporary base.

3. A printed circuit comprising an organic plastic insulating base and a fired conducting element comprising metal particles bonded together by glass, said element being embedded in said base and having a surface flush with one surface of said base.

4. The method of producing an embedded printed circuit having stable, abrasion-resistant conducting portions which must be fired at an elevated temperature which would be detrimental to the insulating base portion of such printed circuit, said method comprising applying the material to form said conducting portions to a smooth-surfaced temporary base in a pattern corresponding to the pattern of the desired printed circuit, firing said material, applying the base material in plastic form against said temporary base and against said conducting material, and separating said base material and said conducting material from said temporary base.

5. A method of producing an embedded printed circuit which comprises applying to a smooth surfaced temporary base in a pattern corresponding to the pattern of a desired printed circuit an electrically conducting material comprising conducting particles and a binder consisting of a nonconducting plastic, applying an organic plastic insulating material against said conducting material and the exposed portions of said temporary base after said conducting material is bonded into an integral construction, and separating said insulating material and said conducting material from said temporary base after said insulating material is bonded into an integral construction with said conducting material embedded therein.

6. A method of producing an embedded printed circuit which comprises applying to a smooth surfaced temporary base in a pattern corresponding to the pattern of a desired printed circuit an electrically conducting material comprising metallic particles and a binder consisting of particles of a nonconducting plastic, heating said conducting material on said temporary base to a temperature at which said binder softens and bonds said material into an integral construction, applying an organic plastic insulating material against said conducting material after said conducting material is so bonded into an integral construction, and separating said insulating material and said conducting material from said temporary base after said insulating material is bonded into an integral construction with said conducting material embedded therein.

7. A method of producing an embedded printed circuit which comprises applying to a smooth surfaced temporary base in a pattern corresponding to the pattern of a desired printed circuit an electrically conducting material comprising metallic particles and a binder consisting of a nonconducting plastic, applying a plastic insulating material against said conducting material after said conducting material is bonded into an integral construction, heating said insulating material to a temperature at which it softens and bonds itself into an integral construction with said conducting material embedded therein and separating said insulating material and said embedded conducting material from said temporary base.

8. A method of producing an embedded printed circuit which comprises applying to a smooth surfaced temporary base in a pattern corresponding to the pattern of a desired printed circuit an electrically conducting material comprising metallic particles and a binder consisting of glass particles, heating said conducting material on said temporary base to a temperature at which said glass particles soften and bond said glass and metal particles into an integral construction, applying an organic plastic insulating material against said conducting material after said conducting material is so bonded into an integral construction, heating said insulating material to a temperature at which it softens and bonds itself into an integral construction with said conducting material embedded therein, and separating said insulating material and said embedded conducting material from said temporary base.

9. A method of producing an embedded printed circuit which comprises applying to a smooth surfaced temporary base in a pattern corresponding to the pattern of a desired printed circuit an electrically conducting material comprising metallic particles and a binder consisting of a thermosetting plastic, heating said conducting material on said temporary base to a temperature at which said binder softens and bonds said material into an integral construction, applying a thermosetting plastic insulating material against said conducting material after said conducting material is so bonded into an integral construction, heating said insulating material to a temperature at which it softens and bonds itself into an integral construction with said conducting material embedded therein, and separating said insulating material and said embedded conducting material from said temporary base.

10. A method of producing an embedded printed circuit which comprises applying to a smooth surfaced temporary base in a pattern corresponding to the pattern of a desired printed circuit, an electrically conducting material in particle form, heating said conducting material to fuse said particles together while retaining rough exposed surfaces, applying a plastic insulating material against said fused conducting material, heating said insulating material to a temperature at which it softens and bonds itself into an integral construction with said fused conducting material embedded therein, and separating said insulating material and said embedded fused conducting material from said temporary base.

References Cited in the file of this patent

UNITED STATES PATENTS

| | | |
|---|---|---|
| 2,419,918 | Scheetz | Apr. 29, 1947 |
| 2,441,960 | Eisler | May 25, 1948 |
| 2,447,541 | Sabee et al. | Aug. 24, 1948 |
| 2,510,750 | Marquardt | June 6, 1950 |